(12) United States Patent
Yoon et al.

(10) Patent No.: US 7,655,389 B2
(45) Date of Patent: Feb. 2, 2010

(54) COMPOSITION FOR FORMING A PHOTOSENSITIVE ORGANIC ANTI-REFLECTIVE LAYER AND METHOD OF FORMING A PATTERN USING THE SAME

(75) Inventors: Sang-Woong Yoon, Seoul (KR); Jong-Chan Lee, Seoul (KR); Ki-Ok Kwon, Seoul (KR); Sang-Ho Cha, Seoul (KR); Geun Huh, Seoul (KR)

(73) Assignees: Samsung Electronics Co., Ltd., Suwon-Si, Gyeonggi-Do (KR); Seoul National University Industry Foundation, Seoul (KR)

( * ) Notice: Subject to any disclaimer, the term of this patent is extended or adjusted under 35 U.S.C. 154(b) by 469 days.

(21) Appl. No.: 11/600,111

(22) Filed: Nov. 16, 2006

(65) Prior Publication Data
US 2007/0184648 A1    Aug. 9, 2007

(30) Foreign Application Priority Data
Nov. 17, 2005    (KR) .................. 10-2005-0110044

(51) Int. Cl.
*G03F 7/11*  (2006.01)
*G03F 7/039* (2006.01)
*H01L 21/30* (2006.01)
*C08F 220/12* (2006.01)

(52) U.S. Cl. .................. 430/323; 430/313; 430/271.1; 430/272.1; 430/280.1

(58) Field of Classification Search ........................ None
See application file for complete search history.

(56) References Cited

U.S. PATENT DOCUMENTS

| | | | |
|---|---|---|---|
| 5,886,102 | A | 3/1999 | Sinta et al. |
| 5,919,599 | A | 7/1999 | Meador et al. |
| 6,054,254 | A | 4/2000 | Sato et al. |
| 6,872,506 | B2 | 3/2005 | Neef et al. |
| 2003/0166828 | A1 | 9/2003 | Cox et al. |
| 2003/0213968 | A1 | 11/2003 | Sivakumar |
| 2003/0215736 | A1 | 11/2003 | Oberlander et al. |
| 2004/0077173 | A1 | 4/2004 | Sivakumar |
| 2005/0074699 | A1 | 4/2005 | Sun et al. |
| 2005/0148170 | A1 | 7/2005 | Bhave et al. |
| 2005/0255410 | A1 | 11/2005 | Guerrero et al. |

FOREIGN PATENT DOCUMENTS

KR              351458        8/2002

*Primary Examiner*—Cynthia Hamilton
(74) *Attorney, Agent, or Firm*—Volentine & Whitt, PLLC

(57) ABSTRACT

A composition for forming a photosensitive organic anti-reflective layer includes about 0.5 to about 5 percent by weight of an acid-labile thermal cross-linking agent that is decomposed by an epoxy group and a photo-acid generator, about 10 to about 22 percent by weight of a copolymer resin that includes an acrylate monomer containing anthracene or a methacrylate monomer containing anthracene, about 0.1 to about 1 percent by weight of a photo-acid generator, and a solvent.

10 Claims, 3 Drawing Sheets

COMPOSITION FOR FORMING A PHOTOSENSITIVE ORGANIC ANTI-REFLECTIVE LAYER AND METHOD OF FORMING A PATTERN USING THE SAME

BACKGROUND OF THE INVENTION

1. Field of the Invention

Example embodiments of the present invention relate to a composition for forming a photosensitive organic anti-reflective layer, and to a method of forming a pattern using the same. More particularly, example embodiments of the present invention relate to a composition for forming a photosensitive organic anti-reflective layer that is used for forming a photoresist pattern, and to a method of forming a pattern using the composition.

A claim of priority under 35 USC §119 is made to Korean Patent Application No. 2005-110044, filed on Nov. 17, 2005, the entire contents of which are herein incorporated by reference.

2. Description of the Related Art

During manufacture of a semiconductor device, a photoresist pattern is used as an etching mask in a photolithography process. To form the photoresist pattern, an anti-reflective layer is formed on a layer prior to deposition of a photoresist film.

The anti-reflective layer reduces the reflection of light from the layer when the photoresist film is patterned by an exposure process of the photolithography process. More particularly, the anti-reflective layer prevents or reduces a stationary wave effect caused by interference between incident light into the photoresist layer and reflected light from the photoresist layer during the exposure process.

Further, the anti-reflective layer prevents or reduces the reflection of light from a stepped portion of underlying patterns that have been formed by a previous fabrication process, and a diffused reflection of light from an edge of the underlying patterns. Therefore, the anti-reflective layer, which is formed prior to depositing a photoresist layer, improves an accuracy of a critical dimension (CD) of a pattern so that process latitude of the semiconductor device is increased.

Anti-reflective layers having the above-mentioned characteristics are generally classified as either inorganic anti-reflective layers or organic anti-reflective layers in accordance with compositions thereof. The inorganic anti-reflective layer exhibits favorable adhesion characteristics with respect to the stepped portion of the underlying layer. However, the inorganic anti-reflective layer is easily not removed in a subsequent process, and exhibits poor adhesion characteristics with respect to the photoresist pattern. Thus, the organic anti-reflective layer is widely utilized instead of the inorganic anti-reflective layer.

In a photolithography process using an organic anti-reflective layer, a composition of the organic anti-reflective layer is spin-coated on a layer to be etched. The composition is then baked to form the organic anti-reflective layer, and a photoresist film is formed on the organic anti-reflective layer. A soft baking process, an exposure process, a hard baking process, a developing process and a dry process are sequentially carried out on the photoresist film to form a photoresist pattern. The organic anti-reflective layer and the layer are sequentially etched using the photoresist pattern as an etching mask, thereby completing the photolithography process.

In this photolithography process, an important process parameter is an etched thickness of the photoresist pattern during the etching process for removing the organic anti-reflective layer from the layer.

Since the photoresist pattern is also etched during etching of the organic anti-reflective layer, a thickness of the photoresist pattern is substantially reduced. Thus, to provide the photoresist pattern with a desired etching selectivity, it is important to reduce the etched thickness of the photoresist pattern during etching of the organic anti-reflective layer.

However, the organic anti-reflective layer has an etch resistivity which is higher than that of a photoresist pattern for ArF or $F_2$. Thus, the photoresist pattern may be excessively removed during etching of the organic anti-reflective layer. As a result, the excessively etched photoresist pattern may not sufficiently function as an etching mask in the etching process for removing the layer.

Therefore, in a case where the etching process for removing the organic anti-reflective layer is carried out, a new organic anti-reflective layer gets removed and prevents loss of the photoresist pattern.

SUMMARY OF THE INVENTION

According to an aspect of the present invention, a composition for forming a photosensitive organic anti-reflective layer is provided, where the composition includes about 0.5 to about 5 percent by weight of an acid-labile thermal cross-linking agent that is decomposed by an epoxy group and a photo-acid generator, about 10 to about 22 percent by weight of a copolymer resin that includes an acrylate monomer containing anthracene or a methacrylate monomer containing anthracene, about 0.1 to about 1 percent by weight of a photo-acid generator, and a solvent.

According to another aspect of the present invention, a method of patterning a layer is provided, where the method includes forming a photosensitive organic anti-reflective layer by coating a composition on a layer, the composition including about 0.5 to about 5 percent by weight of an acid-labile thermal cross-linking agent that is decomposed by an epoxy group and a photo-acid generator, about 10 to about 22 percent by weight of a copolymer resin that includes an acrylate monomer containing anthracene or a methacrylate monomer containing anthracene, about 0.1 to about 1 percent by weight of a photo-acid generator, and a solvent. The method further includes forming a photoresist film on the photosensitive organic anti-reflective layer, simultaneously exposing the photoresist film and the photosensitive organic anti-reflective layer, developing the exposed photoresist film and the exposed photosensitive organic anti-reflective layer using a developing solution to form a photoresist pattern and a photosensitive organic anti-reflective layer pattern, and etching the layer using the photoresist pattern as mask.

BRIEF DESCRIPTION OF THE DRAWINGS

The above and other features and advantages of the invention will become readily apparent from the detailed description that follows, with reference to the accompanying drawings, in which.

DETAILED DESCRIPTION OF EMBODIMENTS

Figure 1:
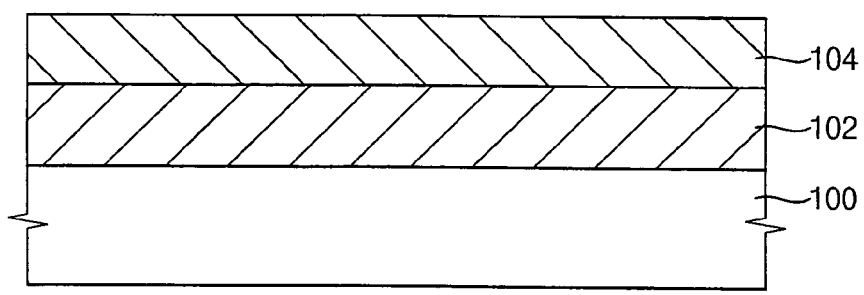
FIGS. 1 to 5 are cross-sectional views for use in explaining a method of forming a pattern using a composition for forming a photosensitive organic anti-reflective layer according to an example embodiment of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on" "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A composition of the present invention is used for forming a photosensitive organic anti-reflective layer. In a developing process, the composition of the present invention includes a developing solution to form a photoresist pattern. That is, the composition is used for forming a photosensitive organic anti-reflective layer that is patterned simultaneously with a photoresist film by a photolithography process.

The composition for forming the photosensitive organic anti-reflective layer that has the above-mentioned characteristics includes an acid-labile thermal cross-linking agent decomposed by an epoxy group and a photo-acid generator, a copolymer resin having an acrylate monomer containing anthracene or a methacrylate monomer containing anthracene, a photo-acid generator, and a solvent.

The acid-labile thermal cross-linking agent is a cross-linking agent for allowing a cross-linking reaction of a copolymer in the composition for the photosensitive organic anti-reflective layer. The acid-labile thermal cross-linking agent is decomposed using the epoxy group and the photo-acid generator.

In the example of this embodiment, the acid-labile thermal cross-linking agent is a chemical compound represented by Chemical Formula 1.

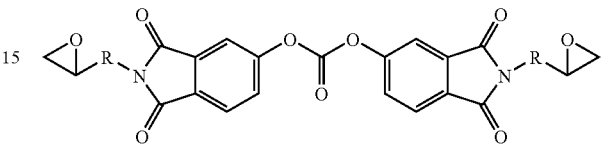

Chemical Formula 1

In Chemical Formula 1, R is a hydrocarbon chain having a carbon number of 1 to 20, preferably an alkyl chain or an aromatic chain having a carbon number of 1 to 20, preferably 1 to 6.

In this example embodiment, the composition for the photosensitive organic anti-reflective layer may include about 0.5 to about 5 percent by weight, preferably about 0.5 to about 3 percent by weight, and more preferably about 0.5 to about 2 percent by weight of the acid-labile thermal cross-linking agent.

The copolymer resin is a polymer that is synthesized by polymerizing the acrylate monomer containing anthracene or the methacrylate monomer containing anthracene, an ethylenically unsaturated monomer and a styrene monomer having an acid-labile protecting group. In this example embodiment, the composition for the photosensitive organic anti-reflective layer includes about 10 to about 22 percent by weight, preferably about 10 to about 18 percent by weight of the copolymer resin.

In the example of this embodiment, the copolymer resin includes the acrylate monomer containing anthracene or the methacrylate monomer containing anthracene that absorbs lights having a wavelength of no more than about 248 nm. The acrylate monomer or the methacrylate monomer is a chemical compound represented by Chemical Formula 2.

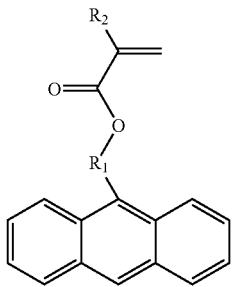

Chemical Formula 2

In Chemical Formula 2, R1 is an alkyl chain having a carbon number of 1 to 20, preferably 1 to 5, and R2 is H or a methyl functional group. In the case of an acrylate monomer, the acrylate monomer may be formed by an esterification reaction between an alkyl alcohol having an anthracene functional group and an acrylic acid. In the case of a methacrylate monomer, the methacrylate monomer may be formed by an esterification reaction between an alkyl alcohol having an anthracene functional group and a methacrylic acid.

Further, the copolymer resin may further include a styrene monomer having hydroxyl group. The styrene monomer includes an acid-labile protecting group that is not thermally reacted with a cross-linking agent and also improves a developing reactivity of the developing solution for the photoresist film. That is, the styrene monomer having the acid-labile protecting group is used for synthesizing the copolymer resin. The styrene monomer has protecting groups such as, for example, a tert-butoxy group, a tert-butoxycarbonyloxy group, an ethoxy group, and/or a tetrahydropyranyloxy group, at positions of ortho, meta and para. Other protecting groups may also be utilized.

Furthermore, the copolymer resin may include an ethylenically unsaturated monomer containing carboxylic acid. That is, the ethylenically unsaturated monomer is used for synthesizing the copolymer. Non-limiting examples of the ethylenically unsaturated monomer may include unsaturated carboxylic acid, ester of acrylic acid, and ester of methacrylic acid.

Non-limiting examples of the unsaturated carboxylic acid may include acrylic acid, methacrylic acid, maleic acid, and fumaric acid. Non-limiting examples of the ester of the acrylic acid may include methyl acrylate, ethyl acrylate, propyl acrylate, isopropyl acrylate, n-butyl acrylate, isobutyl acrylate, n-hexyl acrylate, octyl acrylate, 2-ethylhexyl acrylate, lauril acrylate, 2-hydroxyethyl acrylate, 2-hydroxypropyl acrylate, and glycidyl acrylate.

Further, non-limiting examples of the ester of the methacrylic acid may include methyl methacrylate, ethyl methacrylate, propyl methacrylate, isopropyl methacrylate, n-butyl methacrylate, isobutyl methacrylate, n-hexyl methacrylate, octyl methacrylate, 2-ethylhexyl methacrylate, lauril methacrylate, 2-hydroxyethyl methacrylate, 2-hydroxypropyl methacrylate, and glycidyl methacrylate.

Here, the copolymer resin may be synthesized by the following polymerization process. According to one example of the polymerization process, the monomers for the copolymer resin are dissolved in an organic solvent having a weight which is about 1 to about 5 times greater than that of the monomer used to form a polymeric mixture. Here, non-limiting examples of the organic solvent may include a ketonic solvent such as acetone, and methylethyl ketone; an aromatic hydrocarbonic solvent such as benzene, toluene, and ethylbenzene; a halogenated hydrocarbonic solvent such as carbon tetrachloride and chloroform; and a cyclic esteric solvent such as dioxane. These can be used individually or in a mixture of two or more thereof.

About 0.01 to about 3 percent by weight of a radical polymer initiator such as an organic peroxide or an azo compound based on a weight of the monomer is added to the polymeric mixture. The polymeric mixture including the radical polymer initiator is heated under a nitrogen atmosphere to form the copolymer resin. Here, non-limiting examples of the organic peroxide may include tert-butyl hydroperoxide, cumene hydroperoxide, and tert-butylperoxy pivalate. Further, non-limiting examples of the azo compound may include 2,2'-azobisisobutyronitrile and 2,2'-azobis(2,4-dimethyl)valeronitrile).

Generally, the polymerization may be completed in about 1 to about 12 hours at a temperature of about 50 to about 100° C. However, the duration taken for polymerization may vary in accordance with the types of monomer and polymer initiator used for the polymerization process, a weight-average molecular weight of the copolymer, and so on. Further, after completing the polymerization process, the polymeric mixture is mixed in an organic solvent such as methanol or ethanol to extract copolymer. The copolymer is separated from an intermediate material formed in the polymerization. The copolymer is then dried under a decreased pressure.

Here, an amount of the monomer containing the hydroxyl group or the carboxylic acid used for forming the copolymer resin may be adjusted in accordance with developing conditions of the developing solution for the photoresist film. In this example embodiment, the monomer containing the hydroxyl group or the carboxylic acid is about 20 to about 70 percent by weight based on a total weight of the monomer. Further, a weight-average molecular weight of the copolymer resin may be about 1,000 to about 30,000, preferably about 2,000 to about 15,000.

The photo-acid generator is reacted with light to generate an acid. Non-limiting examples of the photo-acid generator may include diphenyliodonium hexafluorophosphate, diphenyliodonium hexafluoroarsenate, diphenyliodonium hexafluoroantimonate, diphenylparamethoxyphenyl triflate, diphenylparatoluenyl triflate, diphenylparaisobutylphenyl triflate, diphenylpara-tert-butylphenyl triflate, triphenylsulfonium hexafluorophosphate, triphenylsulfonium hexafluoroarsenate, triphenylsulfonium hexafluoroantimonite, triphenylsulfonium triflate, and dibutylnaphthylsulfonium triflate. Further, the photo-acid generator may be about 0.1 to about 1 percent by weight, preferably about 0.1 to about 0.5 percent by weight based on a total weight of the composition for the photosensitive organic anti-reflective layer.

Additionally, the composition for forming the photosensitive organic anti-reflective layer may include one or more additives that are compatible with the above-mentioned components. For example, a surfactant may be added to the composition for forming the photosensitive organic anti-reflective layer.

The surfactant improves coating characteristics of the composition for the photosensitive organic anti-reflective layer and also prevents or reduces the formation of stripes in the photosensitive organic anti-reflective layer. Here, the surfactant may constitute no more than about 2 percent by weight based on a total weight of the composition for forming the photosensitive organic anti-reflective layer. The surfactant may, for example, include a fluorine-containing surfactant such as Surflon SC-103 and SR-100 produced by Asahi Glass Co., LTD. in Japan, EF-361 produced by Tohoku Hiryo K. K. Co. in Japan, and Fluorad Fc-431, Fc-135, Fc-98, Fc430 and Fc-176 produced by Sumitomo 3M Co. in Japan.

The solvent in the composition for the photosensitive organic anti-reflective layer dissolves the acid-labile thermal cross-linking agent, the copolymer resin, the photo-acid generator and the surfactant. Further, the solvent functions to control a viscosity of the composition for forming the photosensitive organic anti-reflective layer.

Here, the solvent may include an organic solvent. Non-limiting examples of the organic solvent may include a ketonic solvent such as acetone, methylethyl ketone, cyclohexanone, methyl isoamyl ketone, 2-heptanone, 1,1,1-trimethylacetone; polyhydric alcohols and derivatives thereof such as ethyleneglycol, ethyleneglycol monoacetate, diethyleneglycol, diethyleneglycol monoacetate, propyleneglycol and propyleneglycol monoacetate as well as monomethyl ether, monoethyl ether, monopropyl ether, monobutyl ether, and monophenyl ether; and a cyclic etheric solvent such as dioxane, an esteric solvent such as ethyl lactate, methyl lactate, ethyl acetate, butyl acetate, methyl pyruvate, ethyl pyruvate, methyl 3-methoxypropionate, and ethyl 3-methoxypropionate. These can be used individually or in a mixture of two or more thereof.

A amount of the solvent that is used may be adjusted in accordance with a thickness and a desired viscosity of the photosensitive organic anti-reflective layer. That is, to increase the thickness of the photosensitive organic anti-reflective layer, it is generally necessary to lower the viscosity of the photosensitive organic anti-reflective layer. As such, the amount of the solvent may be decreased. In contrast, to decrease the thickness of the photosensitive organic anti-reflective layer, it is generally necessary to increase the viscosity of the photosensitive organic anti-reflective layer, in which case the amount of the solvent may be increased.

Method of Forming a Pattern

FIGS. 1 to 5 are cross-sectional views for use in describing a method of forming a pattern using the above-described composition for forming the photoresist organic anti-reflective layer.

Referring to FIG. 1, an object that is to be etched is prepared. In this example embodiment, a layer 102 formed on a semiconductor substrate 100 is used as the object. A surface of the layer 102 is cleaned to remove contaminants from the layer 102. Here, non-limiting examples of the layer 102 may include a silicon nitride layer, a polysilicon layer, and a silicon oxide layer.

A composition for forming a photosensitive organic anti-reflective layer is coated on the cleaned layer 102. Here, the composition includes about 0.5 to about 5 percent by weight of an acid-labile thermal cross-linking agent that is decomposed by an epoxy group and a photo-acid generator; about 10 to about 22 percent by weight of a copolymer resin that has an acrylate monomer containing anthracene or a methacrylate monomer containing anthracene; about 0.1 to about 1 percent by weight of a photo-acid generator; and a solvent. In addition, the composition for forming the photosensitive organic anti-reflective layer may include a surfactant.

A dry process and a pre-baking process are carried out on the semiconductor substrate 100 having the previously described composition for forming the photosensitive organic anti-reflective layer 104. Here, the pre-baking process may be carried out at a temperature of about 100 to about 150° C., preferably about 100 to about 130° C.

Figure 2:
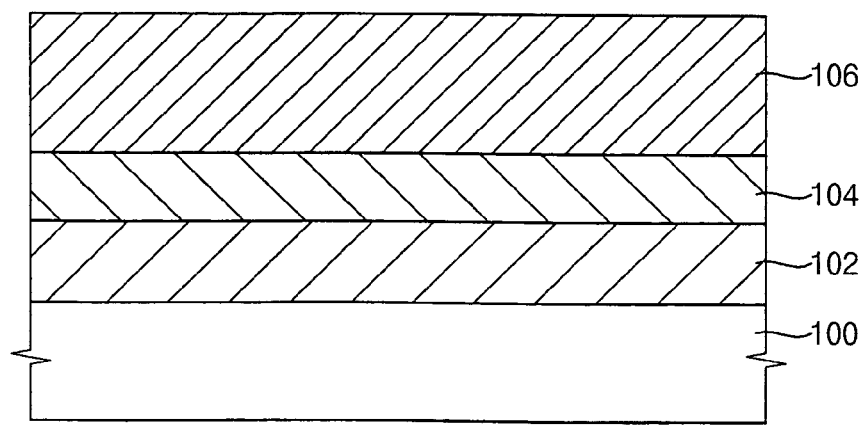

Referring to FIG. 2, a photoresist film 106 is formed on the photosensitive organic anti-reflective layer 104.

Here, non-limiting examples of the photoresist film may include i) a positive-working photoresist composition containing a naphthoquinone diazide compound and a novolak resin, ii) a chemical amplification positive-working photoresist composition containing an acid-generating agent capable of releasing an acid when exposed to light, and a compound capable of being imparted with an increased solubility in an aqueous alkaline-soluble resin, and iii) a chemical amplification positive-working photoresist composition containing an acid-generating agent and an alkali-soluble resin having groups capable of imparting the resin with an increased solubility in an aqueous alkaline solution by decomposition in the presence of an acid.

A primary baking process is performed to heat the semiconductor substrate 100 having the photoresist film 106. Here, the primary baking process may be carried out at a temperature of about 90 to about 120° C. The primary baking process increases an adhesion force of the photoresist film 106 with respect to the photosensitive organic anti-reflective layer 104.

Figure 3:
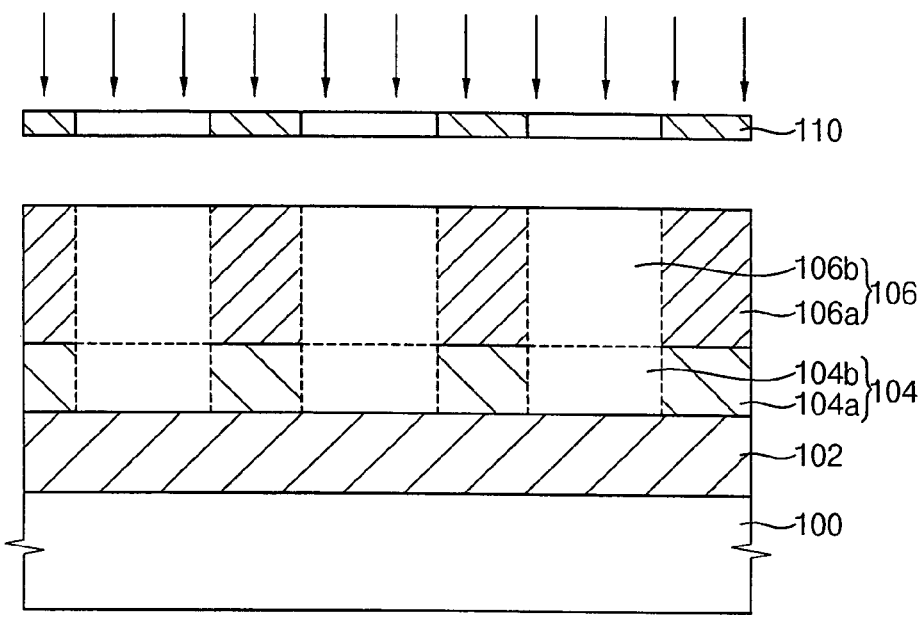

Referring to FIG. 3, the photoresist film 106 is selectively exposed.

For example, in an exposure process for the photoresist film 106, an exposure mask 110 having a mask pattern is placed over a mask stage of an exposure apparatus. The exposure mask 110 is aligned with the photoresist film 106. Light is then irradiated to the mask 110. Light passing through the mask 110 is reacted with the photoresist film 106 over the semiconductor substrate 100. That is, the photoresist film 106 has an exposed portion 106b and a non-exposed portion 106a. Simultaneously, the photosensitive organic anti-reflective layer under the reacted photoresist film 106 is also exposed. Here, non-limiting examples of the irradiated light may include a KrF laser having a wavelength of about 248 nm, and an ArF laser having a wavelength of about 193 nm.

The exposed portion 106b of the photoresist film 106 has a hydrophile property which is higher than that of the non-exposed portion 106a. Therefore, the exposed portion 106b and the non-exposed portion 106a of the photoresist film 106 have different solubilities. Further, since the photosensitive organic anti-reflective layer 104 is also exposed, the photosensitive organic anti-reflective layer 105 has an exposed portion 104b and a non-exposed portion 104a.

A secondary baking process is then carried out on the semiconductor substrate 100. Here, the secondary baking process may be carried out at a temperature of about 90 to about 150° C. After performing the secondary baking process, a state under which the exposed portions 106b of the photoresist film 106 and the exposed portion 104b of the photosensitive organic anti-reflective layer 104 are laid is converted to another state that may be readily soluble when exposed to a solvent.

Figure 4:
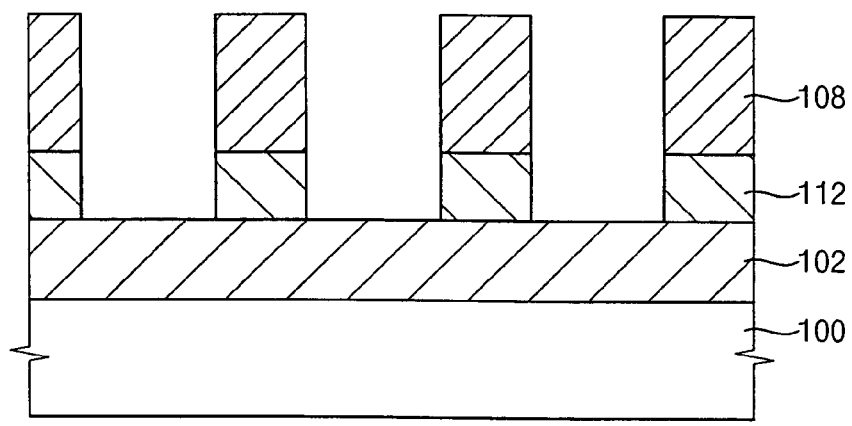

Referring to FIG. 4, the exposed portions 106b of the photoresist film 106 and the exposed portion 104b of the photosensitive organic anti-reflective layer 104 are dissolved using a developing solution. The developed portions of the photoresist film 106 and the photosensitive organic anti-reflective layer 104 are removed to simultaneously form a photoresist pattern 108 and a photosensitive organic anti-reflective layer pattern 112. Particularly, the exposed portions 106b of the photoresist film 106 and the exposed portion 104b of the photosensitive organic anti-reflective layer 104 are sequentially dissolved using a tetra-methyl ammonium hydroxide (TMAH). The developed portions of the photoresist film 106 and the photosensitive organic anti-reflective layer 104 are removed to simultaneously form the photoresist pattern 108 and the photosensitive organic anti-reflective layer pattern 112.

Therefore, after forming the photoresist pattern 108, an additional etching process for forming the photosensitive organic anti-reflective layer pattern 112 may not be required. Further, the photoresist pattern 108 may not be damaged.

Figure 5:
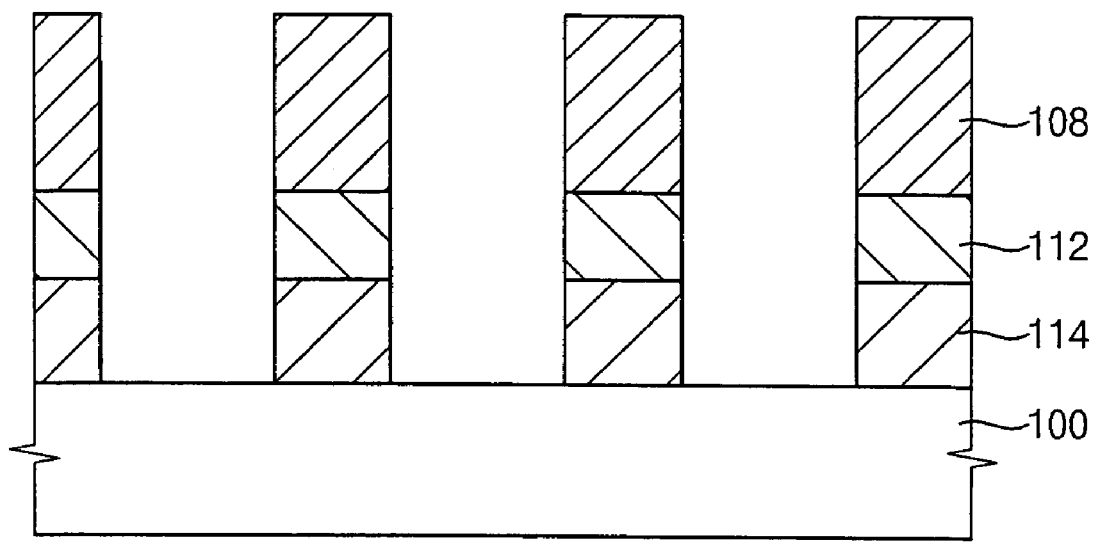

Referring to FIG. 5, the layer 102 is etched using the photoresist pattern 108 as an etching mask to form a pattern 114.

Synthesis examples of an acid-labile thermal cross-linking agent and a copolymer resin and preparation examples of a photosensitive organic anti-reflective layer are presented next. However, the technical scope of the present invention is not limited to the synthesis examples and the preparation examples set forth herein.

Synthesis Example 1

Acid-Labile Thermal Cross-Linking Agent 182 g of 4-hydroxyphthalic acid (1 mol) and 266 g of aryl amine (2 mol) were stirred and dissolved in 2,000 g of a toluene solution to form a preliminary first mixture. The preliminary first mixture was heated to a temperature of 130°

C. to obtain a first mixture. The first mixture was filtered to remove a solvent from the first mixture. The first mixture without the solvent was repeatedly re-crystallized using methanol to obtain 160 g of an imide compound. The imide compound was represented by the Chemical Formula 3.

Chemical Formula 3

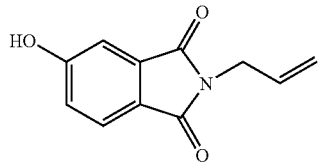

203 g of the imide compound (1 mol) and 202 g of triethyl amine (1 mol) were stirred and dissolved in 2,500 g of a tetrahydrofuran (THF) solution to form a preliminary second mixture. The preliminary second mixture was chemically reacted with 250 g of a THF in which 49.5 g of triphosgene (0.17 mol) was dissolved at a temperature of 0° C. for 30 minutes to form a second mixture. The second mixture was stirred at a temperature of 0° C. for 30 minutes. Further, the second mixture was stirred once more at room temperature for 3 hours. A solvent was then removed from the second mixture. The second mixture without the solvent was dissolved in dichloromethane. The second mixture was cleaned using an ammonium chloride solution and distilled water. The cleaned second mixture was repeatedly re-crystallized using methanol to obtain a carbonate compound represented by Chemical Formula 4.

Chemical Formula 4

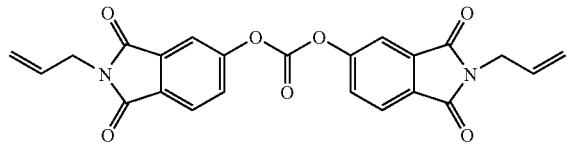

432 g of the carbonate compound (1 mol) and 688 g of 3-chloroperoxybenzoic acid (4 mol) were stirred and dissolved in 200 g of a chloroform solution to form a third mixture. A solvent was removed from the third mixture by a reflux process for 12 hours. The third mixture without the solvent was dissolved in dichloromethane. The third mixture was cleaned using sodium hydrogen carbonate and distilled water. The cleaned third mixture was repeatedly re-crystallized using methanol to obtain an acid-labile thermal cross-linking agent represented by the Chemical Formula 1.

Synthesis Example 2

Copolymer Resin 208 g of 9-anthracene methanol (1 mol), 309 g of dicyclohexyl carbodiimide (1.5 mol) and a methacrylic acid were stirred and dissolved in 2,000 g of a THF solution to form a preliminary mixture. 183 g of 4-dimethyl amino pyridine (1.5 mol) was injected into the preliminary mixture at a temperature of 0° C. to obtain a mixture. The mixture was stirred at room temperature for 6 hours. A solvent was then removed from the stirred mixture. The mixture without the solvent was repeatedly re-crystallized using methanol to obtain 163 g of an anthracene methacrylate monomer. 82 g of the anthracene methacrylate monomer, 34 g of p-tert-butoxystryne and 43 g of methacrylic acid were dissolved in 380 g of propylene glycol monomethyl ether acetate (PMA) to obtain a polymerization mixture. The polymerization mixture was heated at a temperature of 60° C. for 2 hours under a nitrogen atmosphere to synthesize a preliminary copolymer resin. 1 l of n-hexane was injected into the preliminary copolymer resin to remove non-polymerized portions from the preliminary copolymer resin, thereby synthesizing 120 g of copolymer resin. Here, the copolymer resin had a weight-average molecular weight of 5,600 and a dispersion degree of a molecular weight distribution of 2.4.

Preparation Example 1

Composition for an Anti-Reflective Layer 1 percent by weight of the acid-labile thermal cross-linking agent obtained in Synthesis Example 1; 0.3 percent by weight of a triphenylsulfonium hexafluoro phosphate photolytic acid; and 14 percent by weight of the copolymer resin obtained in Synthesis Example 2 were dissolved in 84.6 percent by weight of propyleneglycol monomethyl ether acetate to form a mixture. In addition, 0.1 percent by weight of a fluorine-containing surfactant (Fc-430 produced by Sumitomo 3M Co. in Japan) was added to the mixture. The mixture was then filtered using a membrane filter having a hole diameter of 0.2 μm to prepare an aqueous photosensitive organic anti-reflective layer.

Evaluation of Photosensitive Organic Anti-Reflective Layers

The photosensitive organic anti-reflective layers obtained in Preparation Example 1 were spin-coated on semiconductor substrates disposed on a spinner that was rotated at a speed of 2,000 rpm to 3,000 rpm to form layers having a thickness of 0.4 μm on each of the semiconductor substrates. The layers were dried at a temperature of 30° C. for 60 seconds. Then, the layers were baked in an oven at a temperature of 180° C. for 180 seconds under a nitrogen atmosphere to form photosensitive organic anti-reflective layers having a thickness of 0.2 μm. A chemical amplification positive-working photoresist composition containing an acid-generating agent and a polyhydroxystyrene resin was spin-coated on the photosensitive organic anti-reflective layers. The chemical amplification positive-working photoresist was then dried at a temperature of 90° C. for 90 seconds to form a photoresist film having a thickness of 0.7 μm. The photoresist film was exposed to light having a wavelength of 248 nm by using an exposure apparatus having an exposure mask.

The exposed photoresist film was baked at a temperature of 110° C. for 90 seconds. The baked photoresist film was developed using 2.38 percent by weight of a tetramethyl ammonium hydroxide solution to form a photoresist pattern. Here, the photosensitive organic anti-reflective layer was also developed by the developing solution to form a photosensitive organic anti-reflective layer pattern having a shape which was substantially the same as that of the photoresist pattern.

According to embodiments of the present invention, a photosensitive organic anti-reflective layer may be formed simultaneously with a photoresist pattern during a developing process.

Further, the photosensitive organic anti-reflective layer may suppress reflections of light during the exposure process. Furthermore, the photosensitive organic anti-reflective layer may be developed together with the photoresist film to form the photosensitive organic anti-reflective layer pattern.

Therefore, an additional etching process for forming the photosensitive organic anti-reflective layer pattern after forming the photoresist pattern may not be required, and damage to the photoresist pattern may be reduced or prevented.

Having described the preferred embodiments of the present invention, it is noted that modifications and variations can be made by persons skilled in the art in light of the above teachings. It is therefore to be understood that changes may be made in the particular embodiments of the present invention which are within the scope and the spirit of the invention outlined by the appended claims.

What is claimed is:

1. A composition for forming a photosensitive organic anti-reflective layer, comprising:
   about 0.5 to about 5 percent by weight of an acid-labile thermal cross-linking agent that is decomposed by an epoxy group and a photo-acid generator, wherein the acid-labile thermal cross-linking agent has a chemical structure in accordance with the formula,

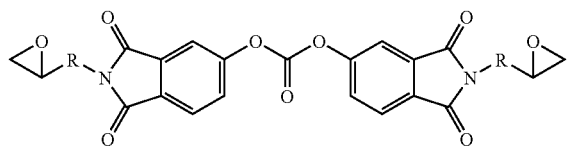

wherein R is a hydrocarbon chain having a carbon number of 1 to 20;
   about 10 to about 22 percent by weight of a copolymer resin that includes an acrylate monomer containing anthracene or a methacrylate monomer containing anthracene;
   about 0.1 to about 1 percent by weight of a photo-acid generator; and
   a solvent.

2. The composition of claim 1, wherein the acrylate monomer or the methacrylate monomer has a chemical structure in accordance with the formula:

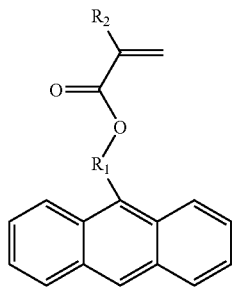

wherein R1 is an alkyl chain having a carbon number of 1 to 20, and R2 is H or a methyl functional group.

3. The composition of claim 1, wherein the acrylate monomer is formed by an esterification reaction between an alkyl alcohol having an anthracene functional group and an acrylic acid, and the methacrylate monomer is formed by an esterification reaction between an alkyl alcohol having an anthracene functional group and a methacrylic acid.

4. The composition of claim 1, wherein the copolymer resin comprises a polymer synthesized by polymerizing the methacrylate monomer containing the anthracene, an ethylenically unsaturated monomer and a styrene monomer having an acid-labile protecting group.

5. The composition of claim 1, wherein the copolymer resin has a weight-average molecular weight of about 3,000 to about 15,000 and a dispersion degree of a molecular weight distribution of about 2.2 to about 2.6.

6. The composition of claim 1, further comprising a surfactant, wherein the composition comprises about 0.5 to about 3 percent by weight of the acid-labile thermal cross-linking agent; about 10 to about 18 percent by weight of the copolymer resin; about 0.1 to about 0.5 percent by weight of the photo-acid generator; about 0.01 to about 0.2 percent by weight of the surfactant; and the solvent.

7. A method of patterning a layer, comprising:
   forming a photosensitive organic anti-reflective layer by coating a composition on a layer, the composition including about 0.5 to about 5 percent by weight of an acid-labile thermal cross-linking agent that is decomposed by an epoxy group and a photo-acid generator, wherein the acid-labile thermal cross-linking agent has a chemical structure in accordance with the formula,

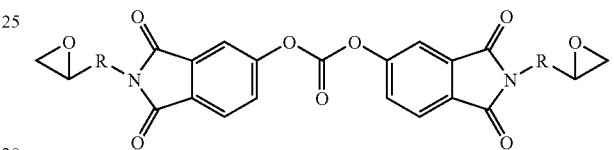

wherein R is a hydrocarbon chain having a carbon number of 1 to 20; about 10 to about 22 percent by weight of a copolymer resin that includes an acrylate monomer containing anthracene or a methacrylate monomer containing anthracene, about 0.1 to about 1 percent by weight of a photo-acid generator, and a solvent;
   forming a photoresist film on the photosensitive organic anti-reflective layer;
   simultaneously exposing the photoresist film and the photosensitive organic anti-reflective layer;
   developing the exposed photoresist film and the exposed photosensitive organic anti-reflective layer using a developing solution to form a photoresist pattern and a photosensitive organic anti-reflective layer pattern; and
   etching the layer using the photoresist pattern as a mask.

8. The method of claim 7, wherein the copolymer resin comprises a polymer synthesized by polymerizing the methacrylate monomer, an ethylenically unsaturated monomer and a styrene monomer having an acid-labile protecting group.

9. The method of claim 7, wherein the copolymer resin has a weight-average molecular weight of about 3,000 to about 15,000 and a dispersion degree of a molecular weight distribution of about 2.2 to about 2.6.

10. The method of claim 7, wherein the composition further comprises a surfactant, and wherein the composition comprises about 0.5 to about 3 percent by weight of the acid-labile thermal cross-linking agent, about 10 to about 18 percent by weight of the copolymer resin, about 0.1 to about 0.5 percent by weight of the photo-acid generator, about 0.01 to about 0.2 percent by weight of the surfactant, and the solvent.

* * * * *